United States Patent
Forejt

(10) Patent No.: US 7,528,760 B2
(45) Date of Patent: May 5, 2009

(54) CLASS D ANALOG-TO-DIGITAL CONVERTER

(75) Inventor: Brett Forejt, Plano, TX (US)

(73) Assignee: Texas Insturments Incorporated, Dallas, TX (US)

( * ) Notice: Subject to any disclaimer, the term of this patent is extended or adjusted under 35 U.S.C. 154(b) by 0 days.

(21) Appl. No.: 11/627,635

(22) Filed: Jan. 26, 2007

(65) Prior Publication Data

US 2008/0180299 A1 Jul. 31, 2008

(51) Int. Cl.
H03M 1/50 (2006.01)
(52) U.S. Cl. .................................... 341/166; 341/155
(58) Field of Classification Search ................ 341/166, 341/155, 167, 168, 169, 170
See application file for complete search history.

(56) References Cited

U.S. PATENT DOCUMENTS

| | | | | |
|---|---|---|---|---|
| 3,868,677 | A * | 2/1975 | Kidd | 341/157 |
| 4,023,159 | A * | 5/1977 | Miyakawa et al. | 341/140 |
| 4,125,896 | A * | 11/1978 | Metcalf | 708/7 |
| 4,214,234 | A * | 7/1980 | Cunningham et al. | 341/118 |
| 4,940,982 | A * | 7/1990 | Gulczynski | 341/169 |
| 5,084,704 | A * | 1/1992 | Parrish | 341/164 |
| 5,148,170 | A * | 9/1992 | Leopold et al. | 341/157 |
| 6,087,968 | A | 7/2000 | Roza | |
| 6,097,325 | A | 8/2000 | Roza | |
| 6,215,434 | B1 | 4/2001 | Roza | |

OTHER PUBLICATIONS

Johns & Martin, "Analog Integrated Circuit Design", Chapter 9, 11, 13 and 14, (1997 John Wiley & Sons).
Razavi, "Principles of Data Conversion System Design", IEEE Press, 1995, Chapter 6.
Engle Roza, "Analog-to-Digital Conversion via Duty-Cycle Modulation", IEEE Transactions on Circuits and Systems II, vol. 44, No. 11, Nov. 1997.
S. Ouzounouv, et al., "Design of High-Performance Asynchronous Sigma Delta Modulators with a Binary Quantizer with Hysteresis", IEEE 2004 CICC, 9-4-1.
S. Ouzounouv, et al., "Analysis and Design of High-Performance Asynchronous Sigma-Delta Modulators with a Binary Quantizer", Journal of Solid-State Circuits, vol. 41, No. 3, Mar. 2006.

* cited by examiner

*Primary Examiner*—Brian Young
(74) *Attorney, Agent, or Firm*—Ronald O. Neerings; Wade James Brady, III; Frederick J. Telecky, Jr.

(57) ABSTRACT

A new analog-to-digital (ADC) circuit and architecture and the corresponding method of implementation are provided. The analog input signal is converted into a modulated pulse stream such as by a pulse-width-modulation scheme. The time-duration width of the pulses are measured by a TDC (time-to-digital converter) and converted to a digital binary representation that is directly correlated with the voltage amplitude of the analog input signal. The circuit implementation is substantially free of switches and circuit issues such as associated with sigma-delta and switched-capacitor techniques for ADC's.

19 Claims, 6 Drawing Sheets

PULSE WIDTH MODULATION

PULSE DENSITY MODULATION

PULSE POSITION MODULATION

CLASS D ANALOG-TO-DIGITAL CONVERTER

CROSS-REFERENCES TO RELATED APPLICATIONS

Not Applicable.

STATEMENT REGARDING FEDERALLY SPONSORED RESEARCH OR DEVELOPMENT

Not Applicable.

FIELD OF THE INVENTION

The present embodiments relate to mixed-signal semiconductor circuits such as on a chip (IC) or to circuits with discrete components such as on a printed circuit board (PCB) and are more particularly directed to an analog-to-digital converter (ADC) circuit and architecture.

BACKGROUND OF THE INVENTION

Electronic systems often include ADC's as a basic building block in order to convert analog input signals to its digital bit representation for use with digital signal processors, memory, digital filters, and CPU's. With today's high density integration process technologies, such as nanometer CMOS, it is possible and easier to process and manipulate digital signals than analog, particularly when the power supply voltage range is low because digital bits can better overcome signal to noise issues. However, the solution has also presented a new problem. Because of the migration towards high density, smaller minimum feature size transistor technologies, ADC's designed in the traditional ways are harder to implement, particularly to achieve medium-to-high resolution.

In the medium-to-high resolution area, say, producing 10 to 16 effective number of bits, popular ADC architectures include the pipeline, sigma-delta, successive approximation (SAR), interpolation, subranging, two-stage and hybrids of these versions. However, they involve much analog circuitry or in the case of the sigma-delta, there is also a massive digital filter circuit, taking up much die area. The analog portion of the circuitry typically requires good matching among its transistors and passives components for the other architectures; therefore the circuit elements need to be large and thus take up much die area. Die area is a premium particularly on the SOC and custom ASIC chips for cost, profit and manufacture yield reasons. For example, an integrated chip for mobile telecommunications, may contain several ADC's along with many other circuit blocks. Each of the ADC's is relatively high resolution and large; so altogether, they will take up much die area.

Moreover, the design of the analog circuit sub-blocks is becoming very difficult on the small geometry size processes, say, 65 nm MOS process. The ADC architectures listed above typically are of the switched capacitor type and require amplifiers and many analog switch circuits to transfer the analog signal, charge and correction terms within the ADC. However, analog switches are very difficult to turn-off completely in the small-geometry technologies due to leakage current which adds undesirable stray charge to the capacitors in the circuit sub-block. Also the amplitude of the analog signal needs to be as large as possible for best signal-to-noise (SNR) results which is then likely to be distorted by the ordinary MOSFET switches because of the makeup of a transistor and its parasitic capacitances and resistances which are voltage amplitude dependent so that distortion is increased and SNDR (signal to noise and distortion) is worsened. Because there are so many analog switches needed in the traditional ADC architectures, it is not practical to design each switch specially (e.g. bootstrap the switch) to overcome their limitations. The other sub-blocks, such as high gain amplifiers in the ADC's, are also harder to design in the new processes. The transconductance of the transistors in the nanometer technologies is generally lower than in older processes; so the gain of a typical amplifier input transistor is lower and feedback distortion is correspondingly higher. The breakdown voltage of the transistors is lower as well so that the overall power supply used to operate the ADC is much lower than before and there is much less voltage headroom to stack up (cascode) the transistors to increase the gain of the amplifiers. So the existing ADC's which rely on these sub-blocks to perform really well, are now very difficult to design to meet performance specifications needed by the overall system applications. Further general background information relating to ADC's and sampling is given, for example, in Johns & Martin, "Analog Integrated Circuit Design", Chapters 9, 11, 13 and 14 (1997 John Wiley & Sons).

For low resolution ADC's, requiring less than 10 bits, flash or fold-interpolate architectures are often used. There is no feedback and the element matching requirement on the comparator stage is stringent; often preamplifiers are needed to magnify the signal to overcome the offsets due to mismatches. So the ADC becomes relatively large and consumes much power. The resistive or reference ladder with which the input signal amplitude is compared to, also consumes much power if it is designed to be a stiff, constant reference.

Another class of ADC's has been described in U.S. Pat. No. 6,087,968 and in a corresponding published article by Engel Roza, "Analog to Digital Conversion via Duty-Cycle Modulation", IEEE CAS II, Vol. 44, No. 11, November 1997. Using a figure from the patent U.S. Pat. No. 6,087,968 (now shown as FIG. 1 in this application), the analog input signal Vin is converted by element 1 into a duty cycle modulated square wave Vs that is then sampled in element 7 which is either a single-phase sampler (e.g. sample-hold circuit, sampling at specific intervals) or a poly-phase sampler. Element 8 is a digital decimating filter converting the samplings of the modulated square wave Vs into digital output bits. A drawback of this methodology is that element 1 is an asynchronous sigma-delta modulator and it also has inherent harmonic distortion. So, there is no clocking (i.e. asynchronous) in element 1 which would align the output signal Vs to other circuits in the rest of the system naturally and an additional alignment circuit is needed. And there needs to be the additional sampling circuit (e.g. sample-hold) 7 following the modulation scheme. Further, though not shown in the figure, a low-pass anti-aliasing filter or hysteresis circuit is often needed prior to the sampler 7 for noise or stability reasons. Yet further, the post-processing digital section, a decimation filter, to turn the modulated pulses into binary data and to do some out-of-band noise removal, is typically large. Therefore, an ADC based on this scheme is still quite large and consumes a fair amount of power.

In view of the above issues, there arises a need to address the drawbacks of the prior art, as is achieved by the preferred embodiments described below.

BRIEF SUMMARY OF THE INVENTION

The present invention provides a circuit and architecture for an analog-to-digital signal conversion (ADC) that make use of modern IC semiconductor process technology advantages such as the high speed of the new transistors (e.g. deep-submicron MOSFET), and that reduce the number of circuits such as amplifiers and particularly analog switches. The new ADC is very compact, low-power and still delivers high performance in one chip. In the case of a PC board level or system level application where more than one chip would be used to implement the architecture, the reduction of the number of components is again useful for reducing cost and board space. Fewer components generally also reduce the effects of stray parasitic capacitances present in the devices, circuit routing and connection nodes.

The embodiments of the ADC include either an open loop structure (no feedback) or a closed loop structure (with feedback), both with a modulated square wave converter (MSWC) and a time to digital converter (TDC). The MSWC generates a modulated pulse stream, such as by using a pulse width modulation (PWM) scheme, thus comparing the ADC's analog input signal with a ramp signal. The modulated pulse stream is passed to the TDC which measures the time-duration width of the pulses in the pulse stream and generates a corresponding digital binary (bit) output indicating the width, which in turn corresponds to the voltage amplitude of the input analog signal. There is generally a master clock input to the ADC that may be used by both the TDC and the MSWC so there is natural and efficient synchronization the pulse stream with the processing in the TDC. The implementation is generally free of much extra circuitry, such as sample-hold circuits, as required in prior arts. This embodiment may be implemented either single-ended or differentially. A final disclosed embodiment is directed towards the method of implementing the circuits of the other embodiments.

DETAILED DESCRIPTION OF THE INVENTION

Figure 1:
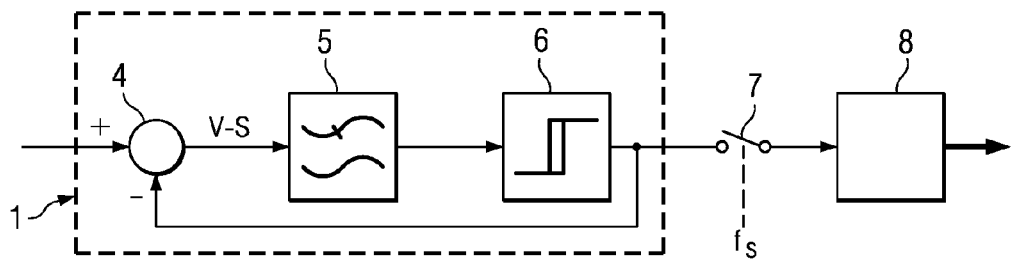
FIG. 1 illustrates a schematic of a prior art ADC architecture.

FIG. 1 is discussed above in the Background of the Invention section of this document and the reader is assumed familiar with the principles of that discussion. For the ADC in this application, instead of quantizing an analog signal in the voltage domain, the analog signal is converted into the time domain (e.g. the time duration of the created pulses corresponds to the amplitude of the analog signal), and then the time domain pulses' widths are sampled (measured) and turned into digital bits which are directly correlated to the voltage amplitude of the original analog signal. As noted in the Background section, the prior art of Engel Roza has a modulation scheme that does have any clocking, forcing a need for extra circuitry, such a sampling circuit, special filtering, decimation and additional timing circuit to align signals from the modulation section to the subsequent circuitry. In contrast, the ADC in this application uses a different modulation scheme that does not need all of this extra circuitry.

For the discussion below, several acronyms are useful. The performance of an ADC is measured by variables such as the effective number of bits (enob), SNR (signal-to-noise ratio), and then including distortion, SNDR.

Figure 2:
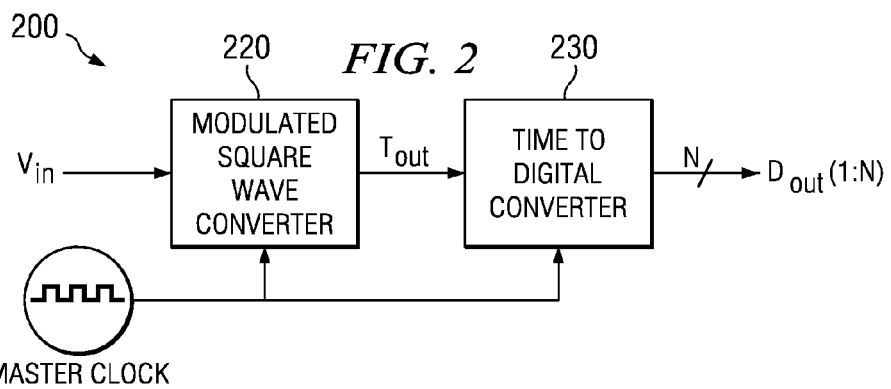
FIG. 2 illustrates a schematic according to one embodiment of the invention.
Figure 3A:
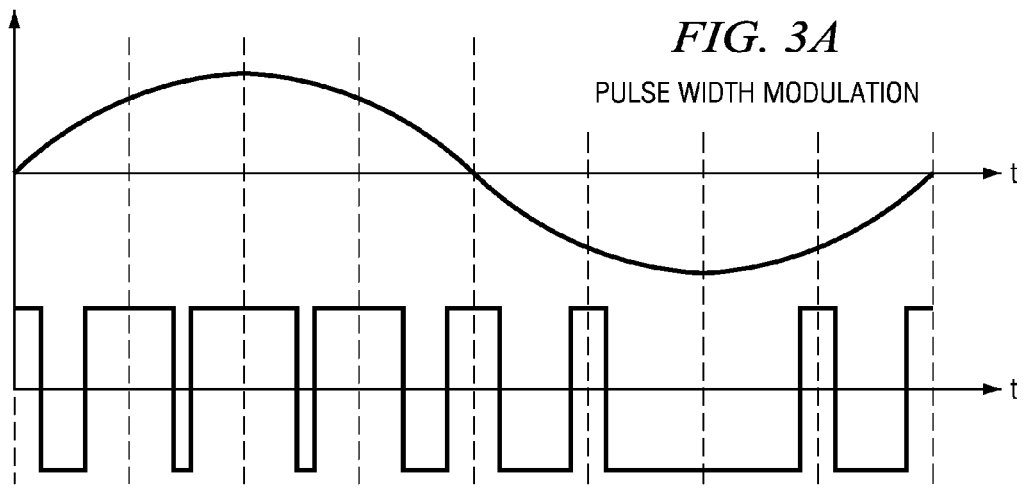
FIG. 3 illustrates example modulation schemes.
Figure 3B:
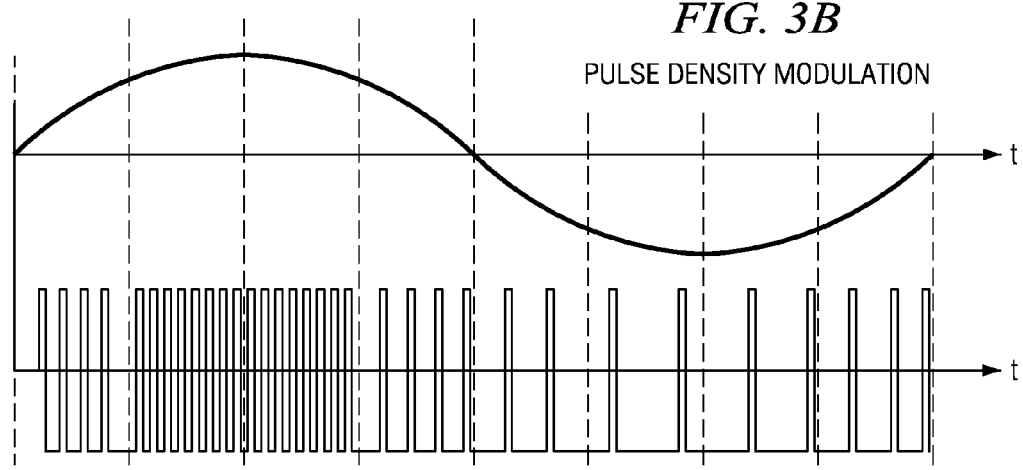
Figure 3C:
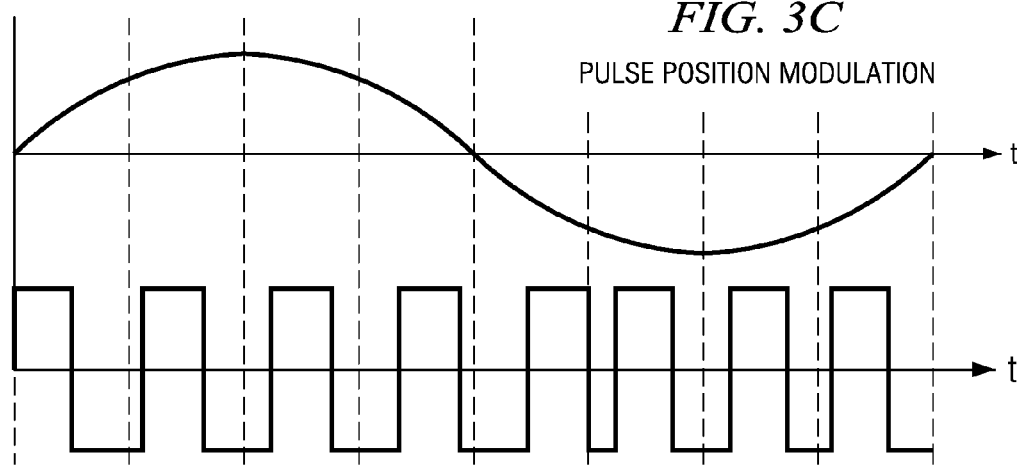

FIG. 2 is a circuit schematic of a preferred embodiment of the invention to convert an analog signal to its digital representation, an ADC. In FIG. 2, the ADC circuit 200 accepts an analog input signal Vin, converts it to a modulated square wave signal Tout in the MSWC (modulated-square-wave converter) 220, then further converts Tout to N number of digital bits Dout(1:N) in the TDC (time-to-digital converter) 230. The MSWC effectively samples the amplitude of the analog signal Vin and provides a time-domain Tout representation of Vin; the time duration of Tout is directly correlated with Vin's amplitude. Then the time duration of Tout pulses is measured to produce Dout, a digital count of Tout's pulse widths, which are directly correlated with the changing amplitude of Vin. The ADC changes from the amplitude axis to the time axis and quantizes the elements on the time axis. The MSWC converts the analog signal Vin to modulated square waves that represent the amplitude of Vin, such as shown in FIG. 3. The sign of the amplitude (crest or trough) may be ascertained, for example, by relying on a reference voltage threshold or other means in the MSWC circuit. FIG. 3 shows a popular PWM (pulse width modulation) scheme that is a simple, favored embodiment of this invention, where the average of the pulse width (time duration) corresponds to the amplitude by some normalization factor. However, alternative modulation schemes may also be used depending on the nature of the second stage, TDC circuitry. For example, the PDM (pulse density modulation) scheme keeps the width of the pulses fixed, but the number of pulses corresponds to the amplitude; and the PPM (pulse position modulation) scheme uses the pulse location within a given time reference to correspond to the amplitude. In a simple implementation, the MSWC is a threshold comparator with two inputs, comparing the voltage of Vin as a first input against the voltage of a triangle wave as second input. When Vin is higher (lower) than some threshold voltage of the triangle wave, the output of the comparator is "high"(HI) and otherwise it is "low" (LO), producing a pulse stream of HI and LO signals, Tout. The choice of modulation scheme will impact the SNR and SNDR of Tout and these dynamic performance issues are often described in the literature on Class D amplifiers.

The TDC (time to digital converter) of FIG. 2 directly converts the Tout signal into N number of digital bits Dout(1: N). In contrast, the prior art scheme requires an intervening sample-hold and time alignment circuitry. In a simple implementation, the TDC may be a high-frequency counter with buffered outputs. The counter will report the number Mp of fixed-width small pulses (regular, brief pulses) that will fit in each of the PWM pulse Tout. The longer the PWM pulse width is, the larger the number Mp and the larger the value of Dout(1:N) will be. The Mp number is normalized through calibration with a voltage scale, so that Dout(1:N) represents the amplitude of Vin with correct scaled units. In a simple implementation, the TDC generally comprises no digital filter.

The TDC will degrade SNR/ENOB because it has some quantization error even in an ideal implementation because a whole number Mp of pulses may not fit evenly into the duration of the Tout pulse. On the rise and fall edges of Tout, a complete period of the brief Mp pulse of the TDC may or may not be contained within Tout. This is a theoretical quantization limit dependent on the width of the short-duration (brief) Mp pulses. If the width is very small, the quantization error is small and the true least bit (LSB) is small. Nowadays, nanometer technologies can readily produce widths of say 50 ps. Aside from the theoretical quantization limit, there are other physical limitations. Jitter, duty cycle and slew rate issues on the edges of Tout and on the edges of the brief Mp pulse will degrade the achievable SNR. With good design, the jitter can be limited to <15% (less than 15%) of the width of the brief Mp pulse; so, this contributes only a small fraction to the LSB. There is additional consideration for the SNR/ENOB performance: the MSWC. It behaves like a sample and hold and therefore it too is jitter sensitive (repeatability of the location of the same time point on the triangle wave relative to a time point on the input signal Vin), and will contribute to the SNR degradation. Well known equations for these issues may be found in Johns & Martin, and also in most data converter design books or manufacture application manuals. An example reference is Razavi, "Principles of Data Conversion System Design", IEEE Press, 1995, chapter 6. Distortion from the circuit components (e.g. transistors) and modulation scheme is typically introduced in the MSWC stage as the system traverse from the analog to digital domain, limiting the SNDR. The triangle wave provided to the comparator may have some distortion, for example, and is not a perfect triangle.

The ADC 200 of FIG. 2 may be implemented in a number of ways, as two discrete chips 220 and 230 on a PC board, as a multi-chip-module (separate die) in a single package, or as circuit blocks on the same chip (IC). System applications, noise concerns, the frequencies involved, and performance specifications dictate the actual implementation.

Figure 4:
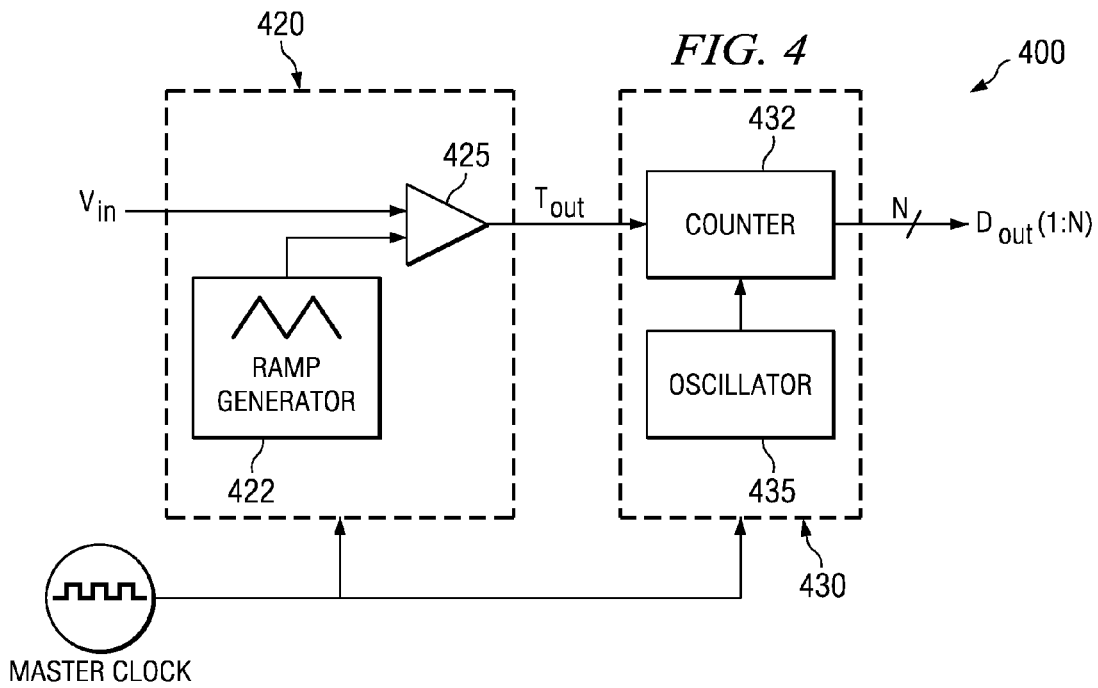
FIG. 4 illustrates a schematic according to a second embodiment of the invention.
Figure 4A:
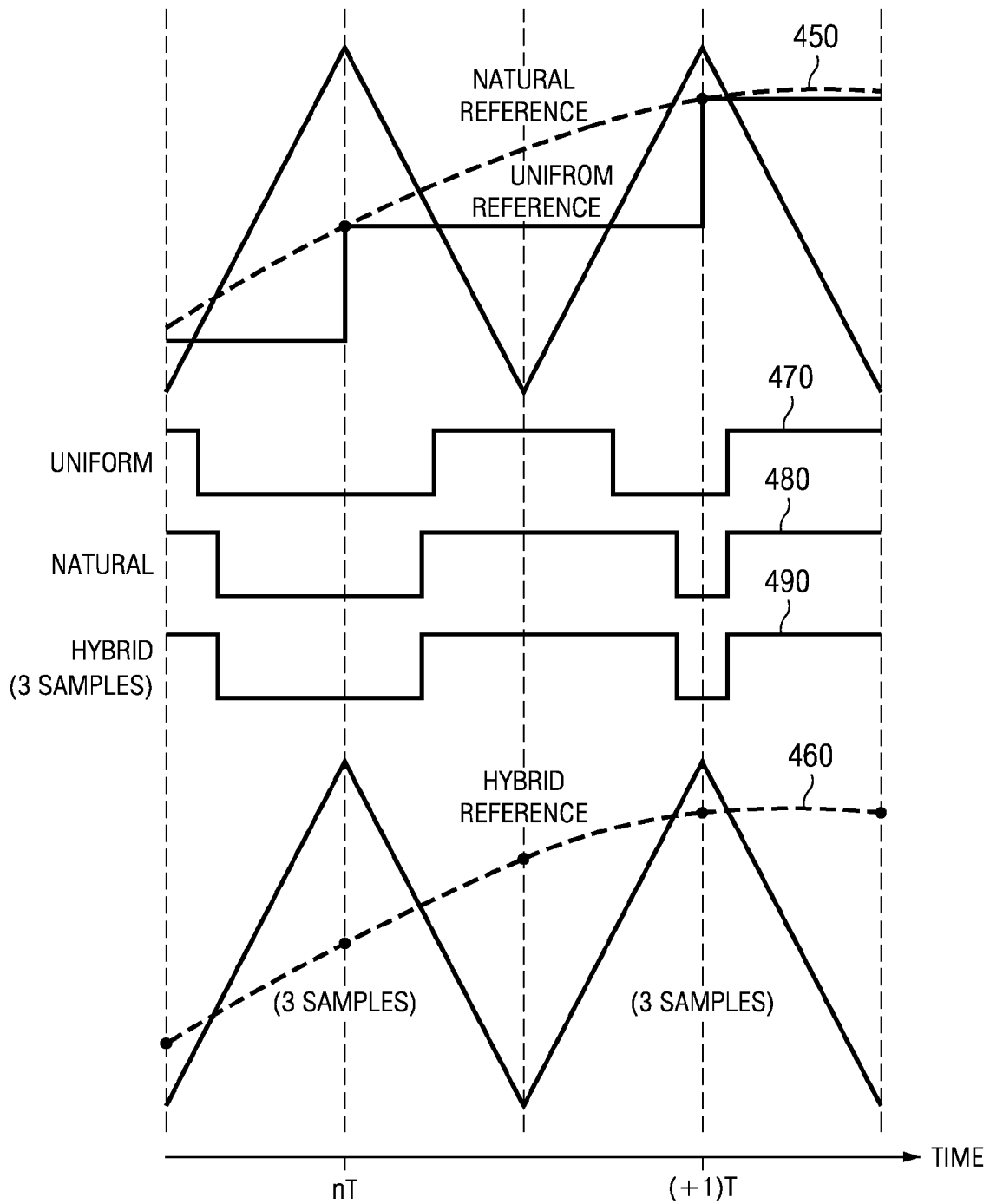
FIG. 4a illustrates example PWM modulation schemes.

FIG. 4 provides a more detailed embodiment of FIG. 2. The ADC 400 has an MSWC 420, comprised of a comparator 425 with input Vin and a ramp signal voltage from a ramp generator 422, to provide an output Tout. Element 420 may be recognized as the front end of a Class D amplifier or as part of a switching voltage regulator (e.g. step-down DC-DC converter). FIG. 4a provides examples of the kind of PWM sampling which may be used in the MSWC to generate Tout, uniform sampling 470, natural sampling 480, hybrid sampling 490 of the analog signal Vin, shown as curves 450 and 460. Natural sampling entails comparing the signal Vin with a fixed-width triangle wave, and uniform sampling defines the pulse widths from regular samples of the signal. The ramp generator circuit 422 is generally small and may just be a current charging and discharging a capacitor to create a triangle (saw-tooth) wave and the rate of (dis)charging may be responsive to the oscillator circuit 435 in the TDC stage 430, or to a master system clock. Alternatively, the ramp generator may create the triangle wave with an integrator with a 50% accurate duty cycle square wave sourced from the oscillator circuit 435. There are many saw-tooth wave generators reported in the literature and patents and will not be considered here in detail. Similarly, many low-power, low-voltage supply comparator designs also exist, particularly in CMOS technologies.

Element 430 in FIG. 4 is a TDC with a counter 432 that is clocked by an oscillator circuit 435 which may have a crystal, VCO, master system clock or input pulse receiver with pulses of a long duration that is further divided down by a divider circuit (not shown) to generate brief Mp pulses for the counter to compare with Tout and verify the number of Mp pulses within Tout. The TDC 430 outputs N digital bits Dout(1:N). An aspect of the invention to note is that the ramp generator 422 has a time period associated with it; it provides a clocked ramp signal that may have its source from some master system clock and/or oscillator circuit the TDC uses. Thus, the two stages 420 and 430 of the ADC are already self-phase-aligned and easily aligned with the rest of the system, which is convenient for large chips, SOC and ASICs, where a master clock typically exists. Because of the natural time alignment (synchronism), the TDC counter may be readily reset and enabled by the comparator output Tout of the MSWC. In contrast, the prior art needs intervening circuitry. Many TDC designs are described in the literature, but the ones containing ADC's are generally not ideal for this invention which itself is an ADC. Simple TDC's may include a ring oscillator for the oscillator circuit 435. The brief Mp pulses may be created by the time delay between signal edges from any two consecutive taps on the ring. A comparator or decision based on the Tout signal amplitude whether Tout is HI or LO (since it is already in digital format) during each Mp pulse may be used to increment or decrement the counter 432. Alternatively, an edge detector based on the Tout signal's rise and fall edges may also be used to notify the counter 432 of Tout's HI/LO status and pulse duration.

Figure 5:
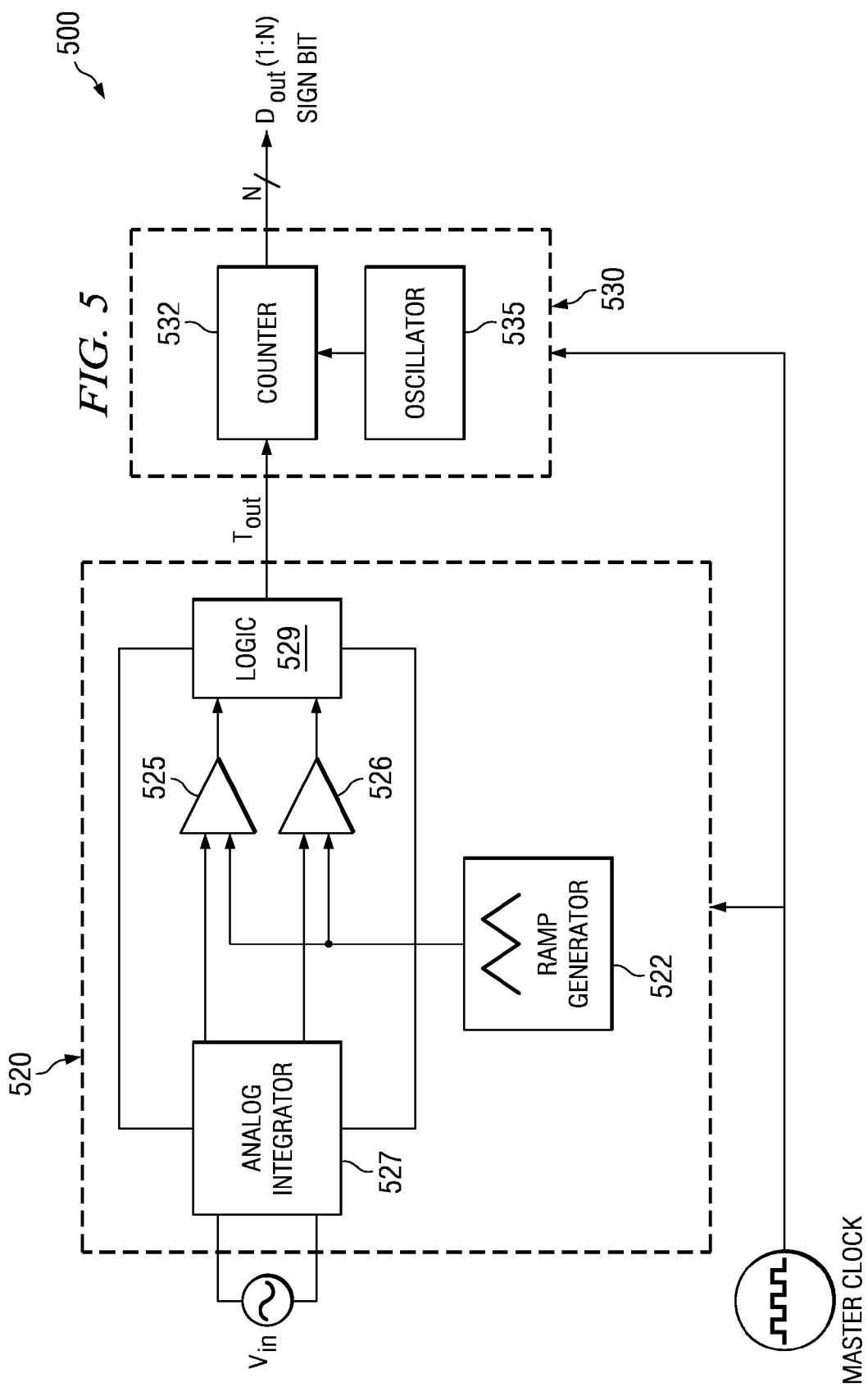
FIG. 5 illustrates a schematic according to a third embodiment of the invention.
Figure 6:
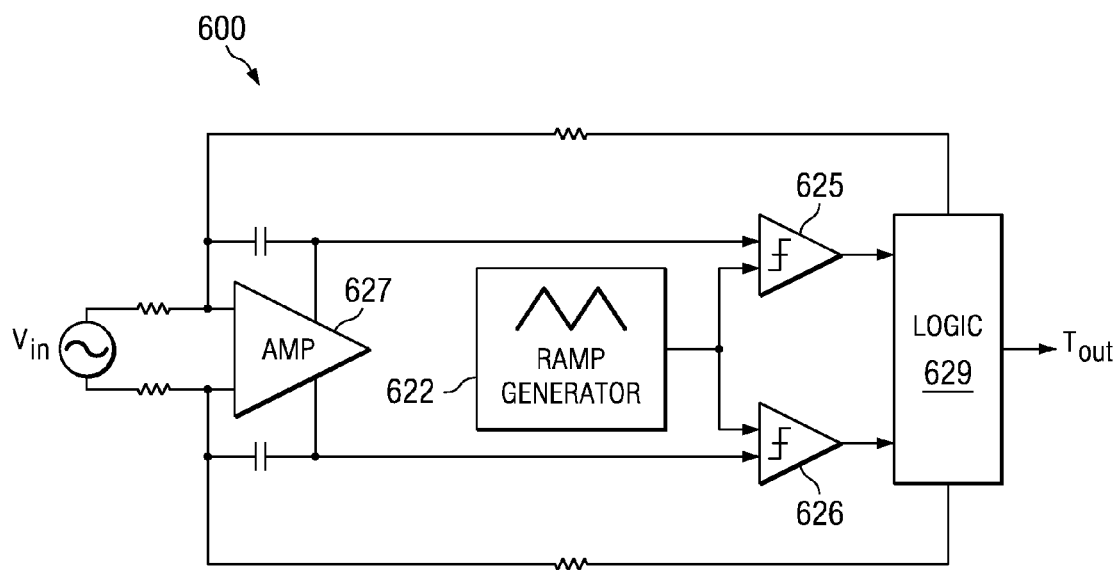
FIG. 6 illustrates a schematic according to a fourth embodiment of the invention.

FIGS. 5 and 6 show a closed loop version of the open-loop architecture of FIG. 4. This embodiment of the ADC has feedback, though again with a MSWC and a TDC circuit. Whereas the MSWC of the previous embodiment comprises a ramp generator and a comparator, the closed-loop embodiment has in addition, more components and one or more stages of integrator circuits. The integrators are continuous time circuits, e.g. free of switches. In a differential implementation, there may also be an additional comparator, plus logic circuitry to coordinate the outputs of the two comparators. The output of the logic circuitry, which is a modulated pulse stream, goes to the TDC to be converted to digital bits. There is feedback network between each of the comparator's output (or from the feedback outputs of the logic circuit) and its corresponding integrator (amplifier) input. The two feedback networks are implemented passively, having passive elements such as resistive components.

Having feedback generally reduces the sensitivity of the first stage, the MSWC, to technology manufacture, mismatches, distortion, power-supply, and various physical non-idealities. However, more circuitry is required, in order to "sum"(difference) together the feedback with the input signal. The inclusion of only a single stage integrator 527 (627) is often sufficient. Using an integrator stage has the advantage that it is a low-pass filter to remove high frequency noise. With the comparator (quantizer) being in the feedback loop, the quantization noise can also be moved to higher frequencies, away from the input signal's frequency, by having an integrator in the transfer function. The integrator may be a simple continuous time, single-pole, RC amplifier circuit with C in the feedback as shown in FIG. 6 (showing the first stage), without having to resort to switched capacitor techniques involving analog switches. FIGS. 5 and 6 actually illustrate a differential version of the architecture of FIG. 4. For noise immunity and for canceling even order harmonic distortion, most analog circuits are developed in a differential form. Two comparators 525 and 526 (625, 626) are thus needed, requiring good matching between the two. Both comparators receive the same saw-tooth signal from the ramp generator 522 (622) as a reference to compare with Vin at the outputs of the integrator. In the differential version, logic 529 (629) is needed to coordinate and phase align the two decisions from the two comparators to form one output pulse stream. In a very high speed system, perhaps phase alignment is needed, using a Phase-Frequency detector for example, but otherwise only simple logic is needed, such as an XOR gate.

Figure 5A:
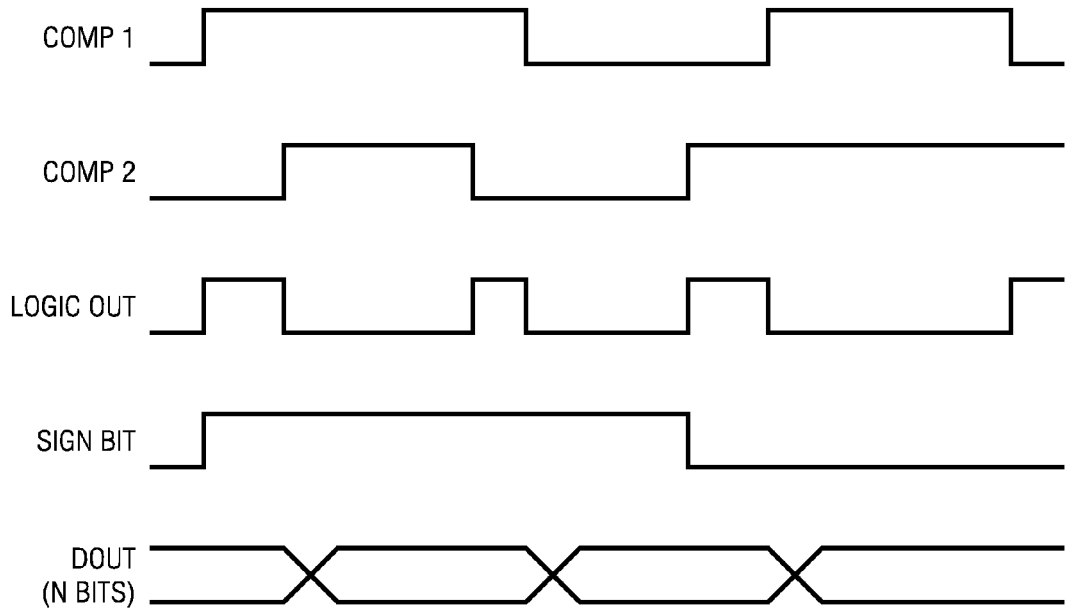
FIG. 5a illustrates a timing diagram for the logic circuit of FIG. 5.

An XOR gate may be used to coordinate the outputs of the comparators, providing the results as shown in FIG. 5a which has the timing diagram for the two comparator outputs Comp1 and Comp2 and the logic output (Tout) which feeds into the TDC. The XOR gate of logic 529 (629) generates a single-ended output Tout pulse like before, in the single-ended version of the ADC, providing a HI level when either of the comparators output a HI, otherwise Tout is LO. In the differential form as opposed to the single-ended version of the ADC, the polarity of the Vin signal may also be easily verified by the logic unit 529 (629), depending on which comparator generates a HI or LO output, so that a sign (polarity) of the signal may be optionally provided to the output of the ADC along with the resolution bits. FIG. 5a shows a timing diagram of the polarity bit. As shown in FIGS. 5 and 6, the logic unit also feeds back the results of each comparator to the corresponding input of the amplifier. The output of the comparators, being digital, is converted in the logic unit into analog by circuitry such as a 1-bit DAC (digital to analog converter) and the output voltage may be scaled to fit the tolerable, dynamic range of the input of the amplifier. The voltage range may be further scaled by the choice of the passive feedback network elements, such as resistors. Higher order implementations, with multiple integrators and nested feedback may be implemented in element 527 of FIG. 5, in the manner of sigma-delta ADC's. However, multiple stages add to the complexity and power consumption of the invention disclosed herein.

Some general performance considerations are now described. Under ideal conditions, free of jitter, distortions and limitations of the ramp generator, and so on, one can expect to achieve an ideal effective number of bits for the ADC with this architecture. For example, if the TDC counter may be run at 20 GHz using the 50 ps case from above, and the ramp circuit of the MSWC has a triangle-wave frequency of 4.88 MHz (effectively the same as the sampling frequency of the analog signal), then an approximately 12 bit ADC may result. The number of the TDC 50 ps pulses can "fit" into and resolve the sampling frequency of the MSWC is 20 GHz/4.88 MHz=$2^{12}$ under ideal conditions. If the input signal Vin frequency is lower than half the sampling rate of 4.88 MHz, then the input signal is oversampled and further improvement to the ADC's SNR is obtained. ADC's have many other performance parameters, such as static DC issues involving offsets, gain errors, differential and integral nonlinearity due to deficiencies in the design of the MSWC and the TDC. Fortunately, these can be removed by calibration conducted during manufacture and during operation. There are also dynamic issues. Pulses of 20 GHz produce much noise on the substrate of the IC chip, affecting the performance of the entire IC. Fortunately, the 20 GHz example and the calibration issues are already demonstrated in nanometer CMOS technology for IC applications such as handsets for wireless communications.

Figure 7:
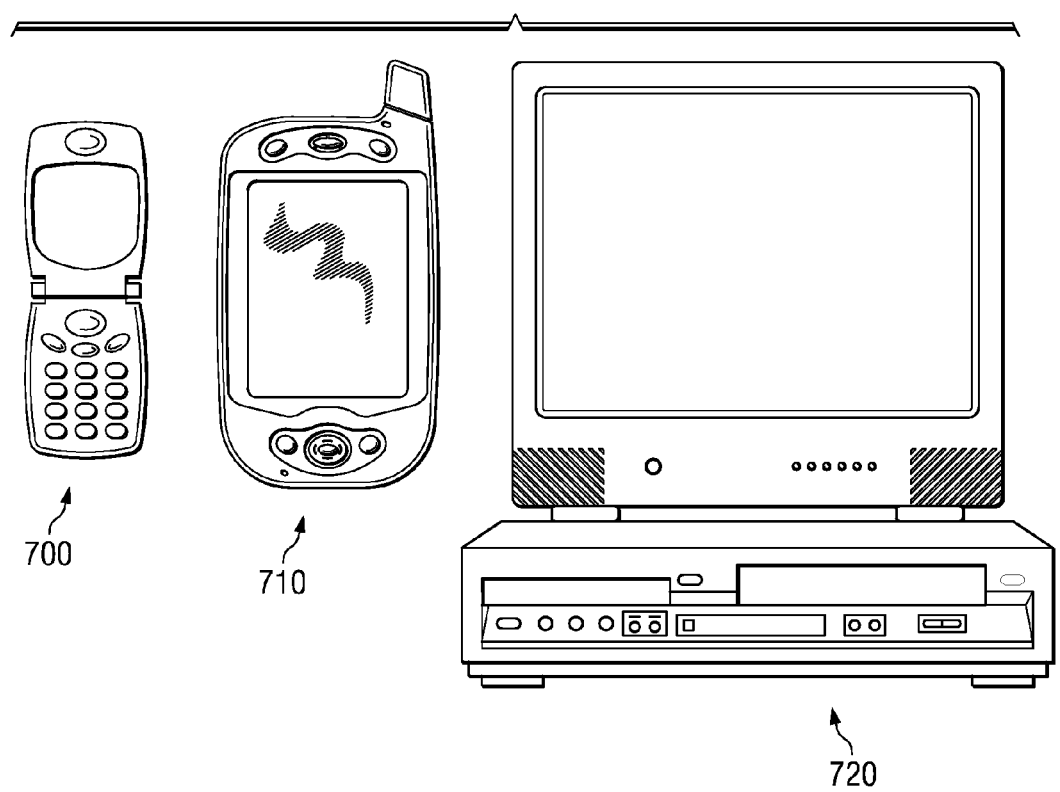
FIG. 7 illustrates example applications which may use the invention.

Example applications which use the ADC circuits of FIGS. 2, 4, 5 and 6 are shown in FIG. 7. Digital or mixed-signal low power system applications typically include battery operated wireless communication equipment such as cell phones 700 and PDA's. Data processing equipment examples include laptops. Entertainment equipment 720 includes HDTV, radio, audio recorders, or game players etc. Medical equipment 710 particularly personal equipment, hearing aids, heart monitor and other sensors used on the body need ADC circuits provided by this invention. Nowadays, hand-held security equipment and taggers (e.g. RFID) are all mixed signal systems and typically need ADC's. Alternatively, high-voltage supply applications such as industrial management systems, automotive applications, and the like can save power and reduce die area size by using the inventive techniques disclosed in this application. Intermediate-voltage supply applications such as for communications (e.g. base-stations) or wall-power applications (e.g. computers, televisions) can utilize this invention for a similar purpose.

From the above, it may be appreciated that the preferred embodiments provide a new ADC architecture and circuits. While these circuits have been motivated by advances in a MOSFET technology, various alternatives may be used by one skilled in the art wherein these preferred embodiments may be implemented. For example, the MOSFET technology may be replaced by a bipolar, BiCMOS, BiCOM, etc. technology. Passive elements shown in the schematics, resistors and capacitors, may be replaced by their transistor equivalents, such as with ON-transistors or gate capacitors. Further, the words "connection", "connected" and "connect" may include real-life physical vias, contacts, metal, short-length poly and the like to physically implement the connection of two nodes (terminals) of a circuit or between circuit blocks which may thus entail small voltage drops, but does not otherwise alter the intended idealness of a connection between, say, two circuit nodes such as shown on the circuit schematics. Given the preceding, therefore, one skilled in the art should further appreciate that while the present embodiments have been described in detail, various substitutions, modifications or alterations could be made to the descriptions set forth above without departing from the inventive spirit and scope, as are defined by the following claims.

The invention claimed is:

1. An analog-to-digital converter (ADC) circuit, comprising:
    an ADC input node, a pulse-stream output node and N digital output nodes;
    a modulated square wave converter (MSWC) connected between the ADC input node and pulse-stream output node;
    a time to digital converter (TDC) connected between the pulse-stream output node and the N digital output nodes, where N is a number greater than one; and
    the MSWC comprising a ramp signal generator operable to help establish a modulated pulse stream at the pulse-stream output node.

2. The ADC circuit of claim 1 wherein the MSWC further comprises a comparator; the ramp signal generator has a ramp output node; and the comparator has a first input node connected to the ADC input node and a second input node connected to the ramp output node; and the comparator has an output node connected to the pulse-stream output node.

3. The ADC circuit of claim 2 wherein the ADC circuit is operable to receive a master clock; and the ramp signal generator and TDC are both operable to generate outputs, in synchronism with the master clock.

4. The ADC circuit of claim 2 wherein the ADC circuit is operable to receive a master clock; and the comparator is operable to output the modulated pulse stream and the TDC is operable to generate N digital outputs, both in synchronism with the master clock.

5. The ADC circuit of claim 1 wherein the TDC comprises a ring oscillator and a counter which has a first input and a second input; and the ring oscillator comprises taps operable to generate regular, brief pulses at the counter's first input; the counter's second input is connected to the pulse-stream output node; and the counter has output nodes which are the N digital output nodes.

6. The ADC circuit of claim 2 wherein the TDC comprises an oscillator circuit and a counter which has a first input and a second input; and the oscillator circuit is operable to generate regular, brief pulses at the counter's first input; the counter's second input is connected to the pulse-stream output node; and the counter has output nodes which are the N digital output nodes.

7. An analog-to-digital converter (ADC) circuit, comprising:
differential ADC input nodes, a pulse-stream output node and N digital output nodes;
a modulated square wave converter (MSWC) connected between the ADC input node and pulse-stream output node;
a time to digital converter (TDC) connected between the pulse-stream output node and the N digital output nodes, where N is a number greater than one; and
the MSWC comprising a ramp signal generator operable to help establish a modulated pulse stream at the pulse-stream output node.

8. The ADC circuit of claim 7 wherein the ADC is a differential circuit and the MSWC has a differential feedback circuit with inputs connected to the differential ADC input nodes; and the differential feedback circuit has an output connected to the pulse-stream output node.

9. The ADC circuit of claim 8 wherein the differential feedback circuit has at least two stages with nested feedback.

10. The ADC circuit of claim 8 wherein the differential feedback circuit further comprises only passive elements operable to provide feedback.

11. The ADC circuit of claim 7 wherein the MSWC comprises an integrator circuit with differential outputs, and two comparators; the ramp signal generator has a ramp output node; the two comparators each have a first input node connected to one of the differential outputs, respectively; the comparators each have a second input node connected to the ramp output node; and the integrator circuit has differential inputs connected to the differential ADC input nodes, respectively.

12. The ADC circuit of claim 11 wherein the two comparators each have a comparator output node; the MSWC further comprises a logic circuit connected to the comparator output nodes, and the logic circuit is further connected to the pulse-stream output node.

13. The ADC circuit of claim 12 wherein the logic circuit has a pair of logic feedback nodes and the integrator circuit has a pair of amplifier input nodes; and the MSWC further comprises a pair of feedback circuits, each between a pairing of the logic feedback node and the amplifier input node.

14. The ADC circuit of claim 12 wherein the logic circuit comprises an XOR gate.

15. The ADC circuit of claim 7 further comprising one polarity bit output node in addition to the N digital output nodes.

16. A method to convert an analog signal into digital form comprises the steps of:
generating a ramp signal;
converting the analog signal to a modulated pulse wave;
providing a counter with pulses from an oscillator and with said modulated pulse wave, the counter producing N digital bits, where N is a number greater than one; and
configuring a modulated square wave converter (MSWC) to generate the modulated pulse wave by comparing the ramp signal with the analog signal.

17. The method of claim 16 further comprising the step of using a PWM (pulse width modulation) scheme to generate the modulated pulse wave.

18. The method of claim 16 further comprising the step of applying feedback in the step of converting the analog signal to the modulated pulse wave.

19. An analog-to-digital converter (ADC) circuit, comprising:
an ADC input node, a pulse-stream output node and N digital output nodes;
a modulated square wave converter (MSWC) connected between the ADC input node and pulse-stream output node;
a time to digital converter (TDC) connected between the pulse-stream output node and the N digital output nodes, where N is a number greater than one; and
the MSWC and TDC both responsive to a same master clock signal, wherein the MSWC is operable to generate a modulated pulse stream at the pulse-stream output node.

* * * * *